United States Patent [19]

Battarel

[11] 4,124,901
[45] Nov. 7, 1978

[54] DOMAIN PROPAGATION REGISTER WITH SINGLE LAYER OF CONDUCTORS

[75] Inventor: Claude Battarel, Magagnosc, France

[73] Assignee: Crouzet, Paris, France

[21] Appl. No.: 779,996

[22] Filed: Mar. 22, 1977

[30] Foreign Application Priority Data

Apr. 1, 1976 [FR] France .............................. 76 09767

[51] Int. Cl.² ........................................... G11C 19/08
[52] U.S. Cl. ...................................... 365/88; 365/133
[58] Field of Search ................. 340/174 ZB; 365/133, 365/88

[56] References Cited

U.S. PATENT DOCUMENTS 3,997,884   12/1976   Battarel et al. ................ 340/174 ZB

*Primary Examiner*—James W. Moffitt

*Attorney, Agent, or Firm*—Holman & Stern

[57] ABSTRACT

A magnetic domain propagation register carrying out the propagation of the domains under the effect of electric currents in a channel formed by an anisotropic soft magnetic substance strip layed out on an insulating substrate, the domain shift conductor, in the form of a Greek border pattern, being single and comprising a hard magnetic layer, an electricity conducting layer and conducting extra-thicknesses decentered in relation to the axis of the Greek border pattern, characterized in that the hard magnetic layer is placed at the base of said conductor, that another hard magnetic layer is coupled to said soft magnetic strip, and that said conducting extra-thicknesses overlap the edge of the Greek border pattern on the input side of the domains under said Greek border pattern.

4 Claims, 5 Drawing Figures

DOMAIN PROPAGATION REGISTER WITH SINGLE LAYER OF CONDUCTORS

The object of the present invention is a magnetic domain propagation register, carrying out the propagation of the domains under the effect of electric currents in a channel formed by an anisotropic soft magnetic substance strip layed out on an insulating substrate, the domain shift conductor, in the form of a Greek border pattern, being single and comprising a hard magnetic layer, an electricity conducting layer and conducting extra-thicknesses decentered in relation to the axis of the Greek border pattern.

The domain propagation register, or memory, is made of one or more shift registers layed out on a plane substrate. The information is represented by magnetic domains which can move with in propagation channels provided within a thin magnetic layer under the effect of alternate magnetic fields created by current pulses applied in a shift conductor, as is for instance described in U.S. Pat. No. 3,997,885 relating to a register which the present Application aims precisely at improving.

To this effect, the register of the invention of the aforementioned type is characterized in that said hard magnetic layer is placed at the base of said conductor, that another hard magnetic layer is coupled to said soft magnetic strip, and that said conducting extra-thicknesses overlap the edge of the Greek border pattern on the side of the input of the domains the domains being under said Greek border pattern.

The domains are magnetized along the layer plane and are stable in the absence of applied current; the store is therefore non volatile. The information density is at present of 15.000 bits/cm2 and will be increased to 100.000 bits/cm2 without notable modification of the production techniques.

On the other hand, the already known registers require at least two distinct conducting layers in order to ensure the domains shifting, writing and reading functions which allow the exploitation of the registers. The present invention provides said functions with a single conduction layer.

The invention will become more apparent from the following description of a preferred embodiment of the register of the invention taken in conjunction with the accompanying drawing wherein.

Figure 1:
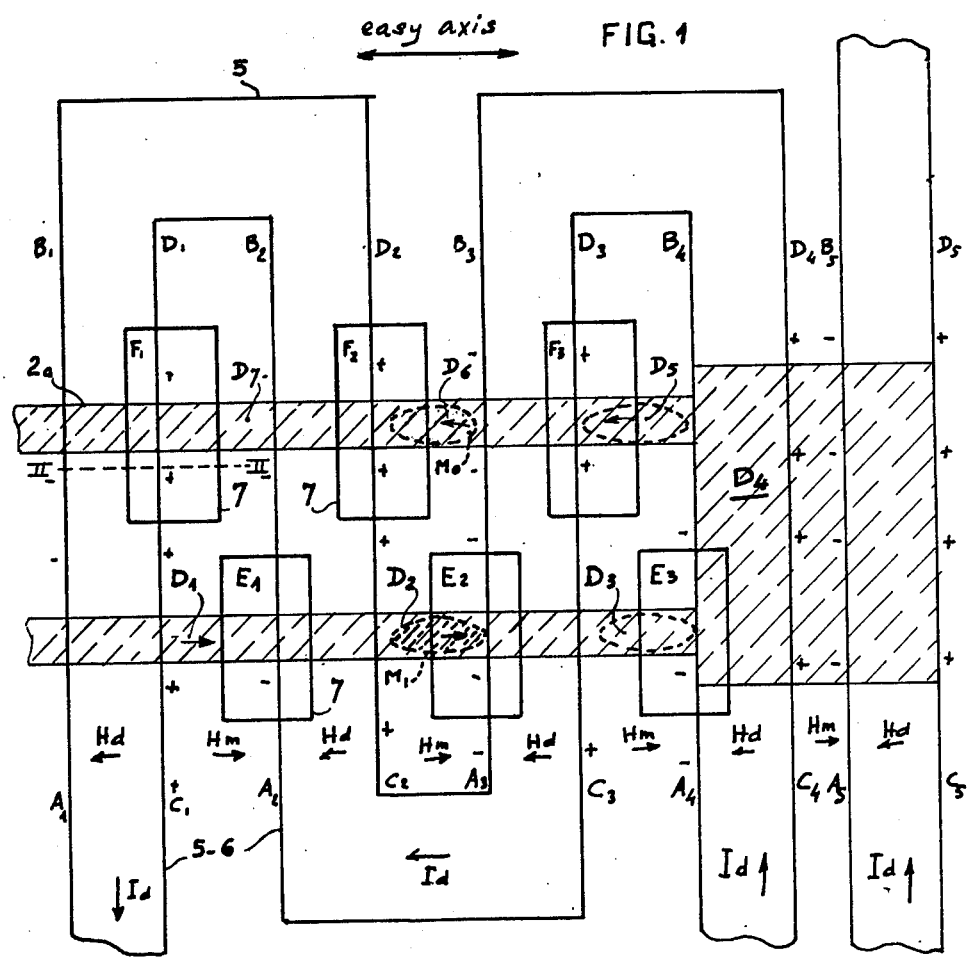
FIG. 1 shows a portion of a propagation couple with the shift conductor in the form of a Greek border pattern.
Figure 2:
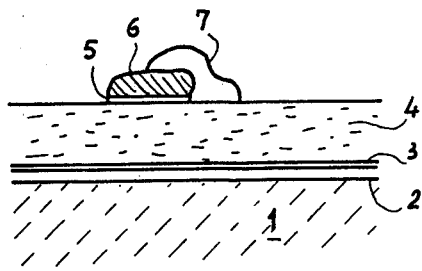
FIG. 2 shows a partial cross-sectional view of a fraction of the shift conductor in the form of a Greek border pattern, along line II—II of FIG. 1.

Refering to FIGS. 1 and 2, the construction mode and the propagation of the domains will now be analyzed.

The domains form areas inside channels $2a$ where the magnetization, refered to vector $M_1$ on FIG. 1, is antiparallel to the initial magnetization direction $M_o$ of the whole of the soft magnetic layer of base 2.

The propagation channels are defined by strips $2a$ on which a photo-sensitive resin have prevented the deposit of a hard layer 3 of coercitive field Hc = 600 Oe, coupled by exchange to the base soft layer 2 of coercitive field Hc = 1,5 Oe. The commutation of the coupled layer being carried out in the region of 50 Oe and the fields supplied by the shift conductor being of the order of 15 Oe, no domain can be formed in the coupled layer outside the propagation channels.

FIG. 1 shows the base structure of the registers. A channel $2a$ is shown as well as the position of a domain $D_2$ hold in the absence of current in the shift conductor 5-6 and forming the memory of an information bit. It can be seen that channel $2a$ comprises two parallel channels with a a transit box $D_4$ widened at the connecting point.

Conservation of small size domains, about 5 $\mu$m in width and 25 $\mu$m in length, is ensured through a magnetostatic field created by a hard magnetic layer 5, of coercitive field Hc = 150 Oe, layed out on the insulating material 4 according to the drawing of the Greek border pattern 5 in FIG. 1. A conducting layer 6, for instance in electrolytic copper, is thereafter layed out on said Greek border pattern for forming the main portion of the shift conductor.

The deposit of conducting extra-thicknesses decentered in relation to the axis of the Greek border pattern finishes the shift conductor. These extra-thicknesses, made for instance by the deposit of electrolytic copper, overlap the edge of the Greek border pattern segments straight above the domains propagation channel and on the domains input side at E and F of FIG. 1.

The finished shift conductor is represented in cross-section in FIG. 2, portion 7 being substantially thicker than portion 6, practically in a ratio of 2 to 3.

The magnetization direction in the hard magnetic layer 3 coupled to base layer 2 is given, during manufacture, by the application of a field of 1300 Oe in the $M_o$ direction.

The magnetization direction in the second hard magnetic layer 5 situated on the insulating material 4 is given, also during manufacture, by the application of a field of 300 Oe in the direction of $M_1$, antiparallel to $M_o$.

The result is magnetic pole lines + and − on the edges of the second hard layer 5 shown in FIG. 1, creating a demagnetizing field Hd below said strips, and a magnetizing field Hm between said strips.

It is this static magnetizing field which provides conversation of the domains at the points of the channel situated partially between the conductors, as is shown by the drawing of domain $D_2$ in FIG. 1.

When a current of suitable polarity Id is applied in the shift conductor, domain $D_2$ increases under the conductor under which it is engaged towards the right hand side in FIG. 1, untill it reaches the neighbouring domain conservation location at $D_3$.

However, the left hand side portion of the domain is erased by the current inversion occuring at the beginning of the following clock time, and all the more so that the erasion time of a domain is several times shorter than its growth time. It is therefore a move forward of half a step at each clock time, that is at each alternation of a train of bipolar pulses.

When the domain reaches position $D_3$, at the following alternation, the domain penetrates the transit box $D_4$ where it grows wider under the effect of the propagation field created by the current of same direction in the conductor segments $A_4 B_4 C_4 D_4$ and $A_5 B_5 C_5 D_5$.

The field applied by the current, of the order of 15 Oe, is sufficient for being greater than the coercitive field of the soft layer increased of the demagnetizing field and of the domain itself and the edges of the transit box. The domain increases until it encompasses the parallel channel at position $D_5$. At the following alternation, of opposite polarity, the domain is erased in box $D_4$ and remains only at $D_5$ and $D_6$. The domain has therefore passed the connecting portion of the channel. The subsequent domain propagation, towards the left hand side in the channel 2a, is similar to the propagation towards the right hand side in the other parallel channel which has been described.

A sufficiently high value of the anisotropy field $Hk > 30$ Oe avoids the formation of new domains when the domain growth fields are applied.

As the substrate can be organized in two phases, a reading and a writing are obtained at each clock time; for instance, the rate per reading line will be 1 Mb/s.

Figure 3:
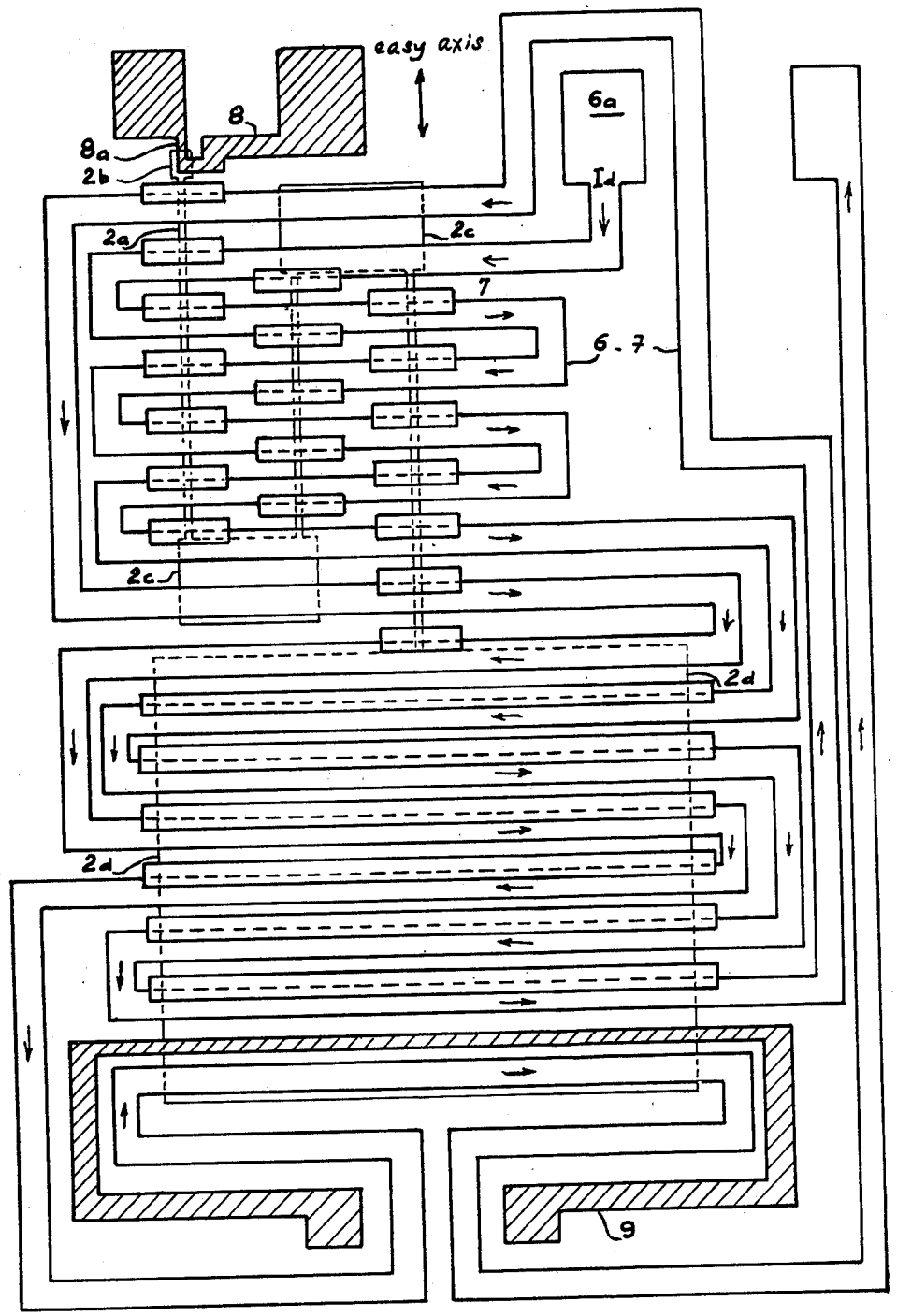
FIG. 3 shows in detail a folded channel and a writing, shifting and reading means of a complete register.

Reference being made to FIG. 3, the complete register will now be described. The writing conductor 8, the shift conductors 6–7 and the reading conductor 9 are realized by the laying out of a same single layer, for instance in copper, on top of the insulating material 4.

The lay-out of the writing conductor 8 in relation to the shift conductors 6–7 is shown in FIG. 3. The narrow portion 8a of the conductor above channel 2a allows the local application of a magnetic field, inclined at 45° in relation to the easy axis, of about 20 Oe by means of a 100 mA current. This transverse field reverses locally the magnetization in propagation channel 2a, and this makes the writing of a bit "1".

The widening of channel 2b, as shown in FIG. 3, allows lowering the writing threshold by diminishing the shape anisotropy.

FIG. 3 shows a channel 2a where forward movement of the domains is carried out in the manner hereabove described. The shift conductor 6–7 surrounds one of its input studs 6a in order to form double passages where the current is sent in the same direction above the transit boxes 2c from a channel segment to the adjacent segment, as is shown by the arrows represented on the conductor.

FIG. 3 shows at 2d a widening portion of the propagation channel 2a above which the shift conductor 6–7 is arranged in double passages in order to increase the size of the domains. The widening of a domain is actually accompanied by a demagnetizing field, related to the domain, which it opposes.

The applied field of about 15 Oe would be insufficient to widen a domain of about 50 μm in length. The paired passages where the current is in the same direction in two adjacent passages allows widening of a domain of about 100 μm in length with said same field of 15 Oe.

For a brief current pulse, for instance of 1 microsecond, the lateral growth of the domain is small, of the order of 100 μm. Several steps will therefore be necessary to widen the domain in a useful manner. FIG. 3 shows two widening steps.

It is necessary to widen the domain up to 1 mm in order to collect a useful signal of the order of one millivolt by variation of the magnetic flux in a flat winding such as winding 9 of FIG. 3 situated on the growth path of a domain.

This flux variation is induced at the passage of the magnetic charges existing at the end of the domain during its growth at the bottom of box 2d under the reading winding 9.

Figure 5:
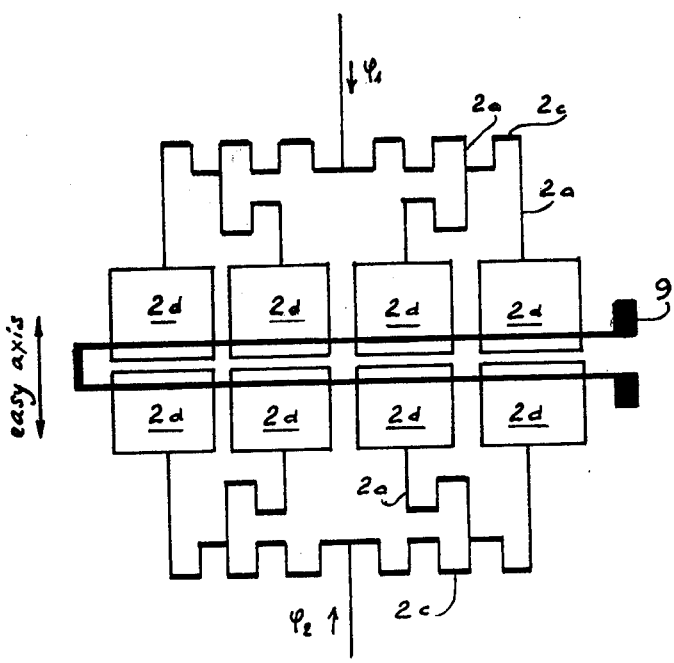
FIG. 5 shows the lay-out of a single reading winding for the two phases of a register providing a signal at each alternation of the shift current.

In order to obtain this widening of the domain with a restricted number of steps, it will be necessary to have in parallel several widenings with a number of equal steps from the input point, as is shown in the diagram of FIG. 5.

Figure 4:
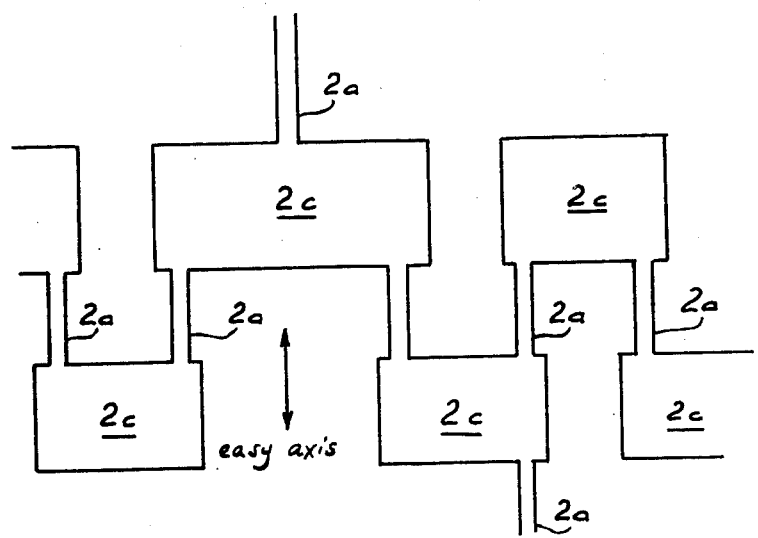
FIG. 4 illustrates the geometry of the channels and of the folding boxes.

FIG. 4 shows the geometry of the connecting boxes 2c of the channel allowing various connections of the domains. FIG. 5 shows the arrangement of a single reading flat winding 9 for the two phases $\phi_1$, $\phi_2$ of a register providing a signal at each alternation of the advance current.

The shift conductor 6 is not shown in FIGS. 4 and 5 for the sake of clarity. The signal existing at the erasion of the domains will not be obstructive since the erasion is much more rapid than the propagation and will take place during the increase step of the current, while the reading of a domain takes place during its propagation, i.e. during the steady step of the current, therefore outside the transition parasites.

The invention provides memories with magnetic domain propagation allowing a very large number of informations in a small space.

What I claim is:

1. A register for propagating, under the action of electric current, magnetic domains in a channel formed by an anisotropic soft magnetic layer deposited on an insulator substrate, said registor comprising:
   an insulator substrate;
   a soft magnetic layer overlying the substrate;
   a first hard magnetic layer overlying said soft magnetic layer except in areas defining said channel, said first hard layer being exchange coupled with said soft layer;
   an insulating layer overlying said first hard layer and said soft magnetic layer;
   a second hard magnetic layer disposed on said insulator layer in a Greek border pattern;
   a shift conductor layer in a Greek border pattern overlying said second hard magnetic layer; and
   an extra-thickness conductor laterally overlying said shift conductor layer on an input side of said Greek border pattern.

2. A register according to claim 1, wherein a single conducting layer is required for providing all the functions useful for the exploitation of the register, i.e., the writing, shifting, holding and reading of the domains carrying the informations, excluding the application of pulsed or static external magnetic fields.

3. A register according to claim 1, wherein the channel comprises two adjacent channel segments within the soft magnetic strip connected together by a connecting box, and the advance of the domain within two adjacent channel segments is carried out by means of a shifting of the conducting extra-thicknesses on the edge of the Greek border pattern towards the domains input.

4. A register according to claim 3, wherein the connecting box comprises a widened transit box connecting the channel segments.

* * * * *